(12) United States Patent
Ahn et al.

(10) Patent No.: US 7,544,596 B2
(45) Date of Patent: Jun. 9, 2009

(54) ATOMIC LAYER DEPOSITION OF GDSCO3 FILMS AS GATE DIELECTRICS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 327 days.

(21) Appl. No.: 11/215,507

(22) Filed: Aug. 30, 2005

(65) Prior Publication Data

US 2007/0048989 A1    Mar. 1, 2007

(51) Int. Cl.
H01L 21/3205 (2006.01)
H01L 21/4763 (2006.01)

(52) U.S. Cl. .................. 438/591; 438/197; 438/593

(58) Field of Classification Search .............. 438/591, 438/593
See application file for complete search history.

(56) References Cited

U.S. PATENT DOCUMENTS

| | | | |
|---|---|---|---|
| 6,495,436 B2 | 12/2002 | Ahn et al. | |
| 6,509,280 B2 | 1/2003 | Choi | |
| 6,514,828 B2 | 2/2003 | Ahn et al. | |
| 6,534,420 B2 | 3/2003 | Ahn et al. | |
| 6,608,378 B2 | 8/2003 | Ahn et al. | |
| 6,632,279 B1 | 10/2003 | Ritala et al. | |
| 6,638,859 B2 | 10/2003 | Sneh et al. | |
| 6,661,058 B2 | 12/2003 | Ahn et al. | |
| 6,700,171 B2 * | 3/2004 | Landheer et al. ............ | 257/411 |
| 6,767,795 B2 | 7/2004 | Ahn | |
| 6,777,353 B2 | 8/2004 | Putkonen | |
| 6,787,413 B2 | 9/2004 | Ahn et al. | |
| 6,803,311 B2 | 10/2004 | Choi | |
| 6,844,203 B2 | 1/2005 | Ahn et al. | |
| 6,844,260 B2 | 1/2005 | Sarigiannis et al. | |
| 6,893,984 B2 | 5/2005 | Ahn et al. | |
| 6,900,122 B2 | 5/2005 | Ahn et al. | |

(Continued)

OTHER PUBLICATIONS

Bender, H. , et al., "Physical Characterisation of High-k Gate Stacks Deposited on HF-Last Surfaces", *Proceedings of the IWGI*, Tokyo, (2001), 86-92.

(Continued)

*Primary Examiner*—Zandra Smith
*Assistant Examiner*—Pamela E Perkins
(74) *Attorney, Agent, or Firm*—Schwegman, Lundberg & Woessner, P.A.

(57) ABSTRACT

The use of atomic layer deposition (ALD) to form a nanolaminate dielectric of gadolinium oxide ($Gd_2O_3$) and scandium oxide ($Sc_2O_3$) acting as a single dielectric layer with a formula of $GdScO_3$, and a method of fabricating such a dielectric layer, is described that produces a reliable structure with a high dielectric constant (high k) for use in a variety of electronic devices. The dielectric structure is formed by depositing gadolinium oxide by atomic layer deposition onto a substrate surface using precursor chemicals, followed by depositing scandium oxide onto the substrate using precursor chemicals, and repeating to form the thin laminate structure. Such a dielectric may be used as gate insulator of a MOSFET, a capacitor dielectric in a DRAM, as tunnel gate insulators in flash memories, or as a NROM dielectric, because the high dielectric constant (high k) of the film provides the functionality of a much thinner silicon dioxide film.

33 Claims, 5 Drawing Sheets

U.S. PATENT DOCUMENTS

| | | | |
|---|---|---|---|
| 6,921,702 | B2 | 7/2005 | Ahn et al. |
| 6,949,787 | B2 * | 9/2005 | Snyder et al. ............... 257/310 |
| 6,953,730 | B2 | 10/2005 | Ahn et al. |
| 6,958,302 | B2 | 10/2005 | Ahn et al. |
| 6,960,538 | B2 | 11/2005 | Ahn et al. |
| 2002/0192974 | A1 | 12/2002 | Ahn et al. |
| 2002/0192975 | A1 | 12/2002 | Ahn |
| 2003/0043637 | A1 | 3/2003 | Forbes et al. |
| 2003/0045078 | A1 | 3/2003 | Ahn et al. |
| 2003/0049942 | A1 | 3/2003 | Haukka et al. |
| 2003/0059535 | A1 | 3/2003 | Luo et al. |
| 2003/0207032 | A1 | 11/2003 | Ahn et al. |
| 2003/0207540 | A1 | 11/2003 | Ahn et al. |
| 2003/0227033 | A1 | 12/2003 | Ahn et al. |
| 2003/0228747 | A1 | 12/2003 | Ahn et al. |
| 2004/0007171 | A1 | 1/2004 | Ritala et al. |
| 2004/0009679 | A1 | 1/2004 | Yeo et al. |
| 2004/0043541 | A1 | 3/2004 | Ahn |
| 2004/0043569 | A1 | 3/2004 | Ahn |
| 2004/0043635 | A1 | 3/2004 | Vaartstra |
| 2004/0110391 | A1 | 6/2004 | Ahn et al. |
| 2004/0135186 | A1 | 7/2004 | Yamamoto |
| 2004/0144980 | A1 | 7/2004 | Ahn et al. |
| 2004/0164357 | A1 | 8/2004 | Ahn et al. |
| 2004/0168627 | A1 | 9/2004 | Conley, Jr. et al. |
| 2004/0171280 | A1 | 9/2004 | Conley, Jr. et al. |
| 2004/0175882 | A1 | 9/2004 | Ahn et al. |
| 2004/0183108 | A1 | 9/2004 | Ahn |
| 2004/0185654 | A1 | 9/2004 | Ahn |
| 2004/0203254 | A1 | 10/2004 | Conley, Jr. et al. |
| 2004/0214399 | A1 | 10/2004 | Ahn et al. |
| 2004/0222476 | A1 | 11/2004 | Ahn et al. |
| 2004/0233010 | A1 | 11/2004 | Akram et al. |
| 2004/0262700 | A1 | 12/2004 | Ahn et al. |
| 2004/0266217 | A1 | 12/2004 | Kim et al. |
| 2005/0009370 | A1 | 1/2005 | Ahn |
| 2005/0020017 | A1 | 1/2005 | Ahn et al. |
| 2005/0023594 | A1 | 2/2005 | Ahn et al. |
| 2005/0023624 | A1 | 2/2005 | Ahn et al. |
| 2005/0023625 | A1 | 2/2005 | Ahn et al. |
| 2005/0023626 | A1 | 2/2005 | Ahn et al. |
| 2005/0026349 | A1 | 2/2005 | Forbes et al. |
| 2005/0029547 | A1 | 2/2005 | Ahn et al. |
| 2005/0029604 | A1 | 2/2005 | Ahn et al. |
| 2005/0029605 | A1 | 2/2005 | Ahn et al. |
| 2005/0032292 | A1 | 2/2005 | Ahn et al. |
| 2005/0037563 | A1 | 2/2005 | Ahn |
| 2005/0054165 | A1 | 3/2005 | Ahn et al. |
| 2005/0077519 | A1 | 4/2005 | Ahn et al. |
| 2005/0124175 | A1 | 6/2005 | Ahn et al. |
| 2005/0140462 | A1 | 6/2005 | Akram et al. |
| 2005/0145957 | A1 | 7/2005 | Ahn et al. |
| 2005/0158973 | A1 | 7/2005 | Ahn et al. |
| 2005/0164521 | A1 | 7/2005 | Ahn et al. |
| 2005/0215015 | A1 | 9/2005 | Ahn et al. |
| 2005/0218462 | A1 | 10/2005 | Ahn et al. |
| 2005/0227442 | A1 | 10/2005 | Ahn et al. |
| 2007/0158765 | A1 | 7/2007 | Ahn et al. |

OTHER PUBLICATIONS

Bender, H. , et al., "Surface reconstruction of hydrogen annealed (100) silicon", *J. Appl. Phys.* 75(12), (Jan. 15, 1994), 1207-1209.

Busch, B. W., et al., "Oxygen exchange and transport in thin zirconia films on Si(100)", *Physical Review B*, vol. 62, No. 20, (Nov. 15, 2000), R13 290-R13 293.

Chang, J. P., et al., "Thermal stability of Ta2O5 in metal-oxide-metal capacitor structures", *Applied Physics Letters*, vol. 74, No. 24, (Jun. 14, 1999), 3705-3707.

Cho, M. H., et al., "Enhanced thermal stability of high-dielectric Gd2O3 films using ZrO2 incorporation", *Applied Physics Letters*, vol. 84, No. 5, (Feb. 2, 2004), 678-680.

Choi, S. C., et al., "Epitaxial growth of Y2O3 films on Si(100) without an interfacial oxide layer", *Applied Physics Letters*, vol. 71, No. 7, (Aug. 18, 1997), 903-905.

Copel, M., et al., "Structure and stability of ultrathin zirconium oxide layers on Si(001)", *Applied Physics Letters*, 76(4), (Jan. 2000), 436-438.

Damlencourt, J.-F. , et al., "Surface treatment for high-quality Al2O3 and HfO2 layers deposited on HF-dipped surface by atomic layer deposition", *Journal of Materials Science: Materials in Electronics* 14, (2003), 379-382.

Endo, Kazuhiko , et al., "Metal Organic Atomic Layer Deposition of High-k Gate Dielectrics Using Plasma Oxidation", *Japanese Journal of Applied Physics*, 42, (2003), L685-L687.

Gupta, J. A., et al., "Gadolinium silicate gate dielectric films with sub-1.5 nm equivalent oxide thickness", *Applied Physics Letters*, vol. 78, No. 12, (Mar. 19, 2001), 1718-1720.

Gusev, E. P., et al., "High-resolution depth profiling in ultrathin Al2O3 films on Si", *Applied Physics Letters*, 76(2), (Jan. 10, 2000), 176-178.

Haukka, Suvi, et al., "Surface coverage of ALE percursors on oxides", *Applied Surface Science* 82/83, (1994), 548-552.

Hubbard, K. J., et al., "Thermodynamic stability of binary oxides in contact with silicon", *Journal of Materials Research*, 11(11), (Nov. 1996), 2757-2776.

Ishii, Hiroyuki, et al., "Growth and electrical properties of atomic-layer deposited ZrO2/Si-nitride stack gate dielectrics", *Journal of Applied Physics*, 95(2), (Jan. 15, 2004), 536-542.

Jonsson, A. K., et al., "Dielectric Premittivity and Intercalation Parameters of Li Ion Intercalated Atomic Layer Deposited ZrO2", *Journal of the Electrochemical Society*, vol. 151, No. 3, (2004), F54-F58.

Lee, Byoung H., et al., "Ultrathin Hafnium Oxide with Low Leakage and excellent Reliability for Alternative Gate Dielectric Application", *IEEE Technical Digest of International Electron Devices Meeting* 1999, 133-136.

Loup, V. , et al., "Reduced pressure chemical vapour deposition of Si/Si1-x-yGexCy heterostructures using a chlorinated chemistry", *Semiconductor Science and Technology* 18, (2003), 352-360.

Paivasaari, Jani, et al., "A comparative study on lanthanide oxide thin films grown by atomic layer deposition", *Thin Solid Films*, 472(1-2), First available online in 2004, (Jan. 24, 2005), 275-281.

Park, Dae-Gyu , et al., "Characteristics of Al2O3 Gate Dielectrics Prepared by Atomic Layer Deposition for Giga Scale CMOS DRAM Devices", *2000 Symposium on VLSI Technology Digest of Technical Papers*, (2000), 46-47.

Putkonen, Matti , et al., "Surface-Controlled Deposition of Sc2O3 Thin Films by Atomic Layer Epitaxy Using Beta-Diketonate and Organometallic Precursors", *Chem. Mater.* 13(12), (Oct. 12, 2001), 4701-4707.

Ritala, Mikko , et al., "Perfectly Conformal TiN and Al2O3 Films Deposited by Atomic Layer Deposition", *Chemical Vapor Deposition*, vol. 5, No. 1, (1999), 7-9.

Rivillon, Sandrine , et al., "Gas phase chlorination of hydrogen-passivated silicon surfaces", *Applied Physics Letters*, vol. 85, No. 13, (Sep. 27, 2004), 2583-2585.

Robertson, J. , "Band offsets of wide-band-gap oxides and implications for future electronic devices", *Journal of Vacuum Science & Technology B (Microelectronics and Nanometer Structures)*, 18(3), (May-Jun. 2000), 1785-1791.

Sneh, Ofer , "Thin film atomic layer deposition equipment for semiconductor processing", *Thin Solid Films*, 402(1-2), (Jan. 2002), 248-261.

Wilk, G. D., et al., "High-K gate dielectrics: Current status and materials properties considerations", *Journal of Applied Physics*, 89(10), (May 2001), 5243-5275.

Youm, Minsoo , et al., "Metal Oxide Semiconductor Field Effect Transistor Characteristics with Iridium Gate Electrode on Atomic Layer Deposited ZrO2 High-k Dielectrics", *Jpn. J. Appl. Phys.*, vol. 42, (Aug. 2003), 5010-5013.

Zhao, C., et al., "Ternary rare-earth metal oxide high-k layers on silicon oxide", *Applied Physics Letters*, vol. 86, 132903, (2005), 3 pages.

Zhu, X.-Y., et al., "Molecular Assemblies on Silicon Surfaces via Si-O Linkages", *Langmuir*, vol. 16. No. 17, (2000), 6766-6772.

"U.S. Appl. No. 11/215,578 Response to Restriction Requirement mailed Nov. 9, 2007", 13.

"U.S. Appl. No. 11/215,578 Restriction Requirement mailed", 4 pgs.

Leskela, M., "ALD precursor chemistry: Evolution and future challenges", *J. Phys. IV France*, 9, (1999),837-852.

Suntola, Tuomo, "Atomic layer epitaxy", *Thin Solid Films*, 216(1), (Aug. 28, 1992),84-89.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Ahn, Kie Y., et al., "ALD of Amorphous Lanthanide Doped TIOX Films", U.S. Appl. No. 11/092,072, filed Mar. 29, 2005.

Ahn, Kie Y., et al., "Atomic Layer Deposited Hafnium Tantalum Oxide Dielectrics", U.S. Appl. No. 11/029,757, filed Jan. 5, 2005.

Ahn, Kie Y., et al., "Atomic Layer Deposited Lanthanum Aluminum Oxide Dielectric Layer", U.S. Appl. No. 10/930,167, filed Aug. 31, 2004.

Ahn, Kie Y., et al., "Atomic Layer Deposited Lanthanum Hafnium Oxide Dielectrics", U.S. Appl. No. 11/010,529, filed Dec. 13, 2004.

Ahn, Kie Y., et al., "Atomic Layer Deposited Titanium Silicon Oxide Films", U.S. Appl. No. 11/093,104, filed Mar. 29, 2005.

Ahn, Kie Y., et al., "Atomic Layer Deposited Zirconium Silicon Oxide Films", U.S. Appl. No. 11/117,121, filed Apr. 28, 2005.

Ahn, Kie Y., et al., "Atomic Layer Deposition of a Ruthenium Layer to a Lanthanide Oxide Dielectric Layer", U.S. Appl. No. 11/117,125, filed Apr. 28, 2005.

Ahn, Kie Y., et al., "Atomic Layer Deposition of CEO2/AL2O3 Films as Gate Dielectrics", U.S. Appl. No. 11/055,380, filed Feb. 10, 2005.

Ahn, Kie Y., et al., "Atomic Layer Deposition of DY-Doped HFO2 Films as Gate Dielectrics", U.S. Appl. No. 11/053,577, filed Feb. 8, 2005.

Ahn, Kie Y., et al., "Atomic Layer Deposition of Hf3N4/HfO2 Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Atomic Layer Deposition of Zr3N4/ZrO2 Films as Gate Dielectrics", U.S. Appl. No. 11/058,563, filed Feb. 15, 2005.

Ahn, Kie Y., et al., "Atomic Layer Deposition of ZRC HFY SN1-X-Y O2 Films as High K Gate Dielectrics", U.S. Appl. No. 11/215,530, filed Aug. 29, 2005.

Ahn, Kie Y., et al., "Cobalt Titanium Oxide Dielectric Films", U.S. Appl. No. 11/216,958, filed Aug. 31, 2005.

Ahn, Kie Y., et al., "Hafnium Titanium Oxide Films", U.S. Appl. No. 11/140,643, filed May 27, 2005.

Ahn, Kie Y., et al., "Hybrid ALD-CVD of PrXOY/ZrO2 Films as Gate Dielectrics", U.S. Appl. No. 11/010,766, filed Dec. 13, 2004.

Ahn, Kie Y., et al., "Iridium / Zirconium Oxide Structure", U.S. Appl. No. 11/152,759, filed Jun. 14, 2005.

Ahn, Kie Y., et al., "Lanthanum Aluminum Oxynitride Dielectric Films", U.S. Appl. No. 11/216,474, filed Aug. 31, 2005.

Ahn, Kie Y., et al., "Magnesium Titanium Oxide Films", U.S. Appl. No. 11/189,075, filed Jul. 25, 2005.

Ahn, Kie Y., et al., "Ruthenium Gate for a Lanthanide Oxide Dielectric Layer", U.S. Appl. No. 10/926,812, filed Aug. 26, 2004.

Ahn, Kie Y., et al., "Semiconductor Constructions Comprising Cerium Oxide and Titanium Oxide; and Methods of Forming Semiconductor Constructions", U.S. Appl. No. 10/881,874, filed Jun. 29, 2004.

Ahn, Kie Y., et al., "Zirconium-Doped Gadolinium Oxide Films", U.S. Appl. No. 11/215,578, filed Aug. 29, 2005.

"U.S. Appl. No. 11/215,578 Restriction Requirement mailed", 4 pgs, mailed Oct. 11, 2007.

* cited by examiner

ATOMIC LAYER DEPOSITION OF GDSCO3 FILMS AS GATE DIELECTRICS

TECHNICAL FIELD

This application relates generally to semiconductor devices and device fabrication, and more particularly to dielectric layers and their method of fabrication.

BACKGROUND

The semiconductor device industry has a market driven need to continue to reduce the size of semiconductor devices such as transistors in order to obtain lower power consumption and higher performance. To reduce transistor size, the thickness of the silicon dioxide, $SiO_2$, gate dielectric is reduced in proportion to the shrinkage of the gate length. For example, a metal-oxide-semiconductor field effect transistor (MOSFET) might use a 1.5 nm thick $SiO_2$ gate dielectric for a gate length of 70 nm. An industry goal is to fabricate increasingly smaller and more reliable integrated circuits (ICs) for use in products such as processor chips, mobile telephones, and memory devices such as dynamic random access memories (DRAMs).

The semiconductor industry relies on the ability to reduce or scale the dimensions of its basic devices, primarily, the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics, in particular dielectrics with higher dielectric constants (k) to replace the conventional use of various combinations of $SiO_2$, $Si_3N_4$ and SiON. For these higher dielectric constant materials to be practical they must have the properties of high permittivity, thermal stability, high film and surface quality and smoothness, low hysteresis characteristics, low leakage current density, and long term reliability. High k films may be amorphous metal oxide unary materials such as $Al_2O_3$, $CeO_2$, $HfO_2$ and $ZrO_2$, which have a single component, or binary systems such as $(Y_2O_3)_x(ZrO_2)_{1-x}$, $LaAlO_3$, and $(HfO_2)_x(Al_2O_3)$, which have two components, and so on. High k films may be single layers, or may be formed of multiple layers of different materials that act as a composite material. The high k films are preferably amorphous to maintain surface smoothness and prevent electric field concentration at sharp projections, and to minimize leakage current along crystal boundaries. There is a need in the industry to find a method of forming high k films that possess the above noted features and are practical for use in manufacturing integrated circuits (ICs).

SUMMARY

The abovementioned problems are addressed by the present invention and will be understood by reading and studying the following specification.

An embodiment of a method for forming an electronic device includes forming a dielectric layer by using an atomic layer deposition (ALD) technique to form a nanolaminate layered dielectric having layers of gadolinium oxide ($Gd_2O_3$) and scandium oxide ($Sc_2O_3$) in any order desired. The dielectric structure acts as a single dielectric layer, and is formed by depositing gadolinium oxide by atomic layer deposition onto a substrate surface using precursor chemicals containing gadolinium compounds, followed by a purge and deposition of an oxidizing material such as ozone, hydrogen peroxide or water vapor to form a thin (often a single molecular layer) film of $Gd_2O_3$. This step may be repeated to obtain a film having a desired thickness. Formation continues with ALD depositing scandium oxide using precursor chemicals containing scandium compounds, followed by a purge and deposition of an oxidizing material such as ozone or water vapor to form a thin film of $Sc_2O_3$. This step may be repeated to obtain a film having a desired thickness. Then repeating both of the steps as often as necessary to form a thin laminate dielectric structure of the required thickness. Either $Gd_2O_3$, or $Sc_2O_3$ may be deposited first. A dielectric layer formed of scandium oxide and gadolinium oxide may be beneficially used in electronic devices because the high dielectric constant (high k) of the film provides the functionality of a thinner silicon dioxide film without the reliability loss consequent to using such thin oxide films.

Embodiments include structures for capacitors, transistors, memory devices, and electronic systems with dielectric layers containing an atomic layer deposited gadolinium oxide and scandium oxide, and methods for forming such structures. These and other aspects, embodiments, advantages, and features will become apparent from the following description and the referenced drawings.

DETAILED DESCRIPTION

Figure 1:
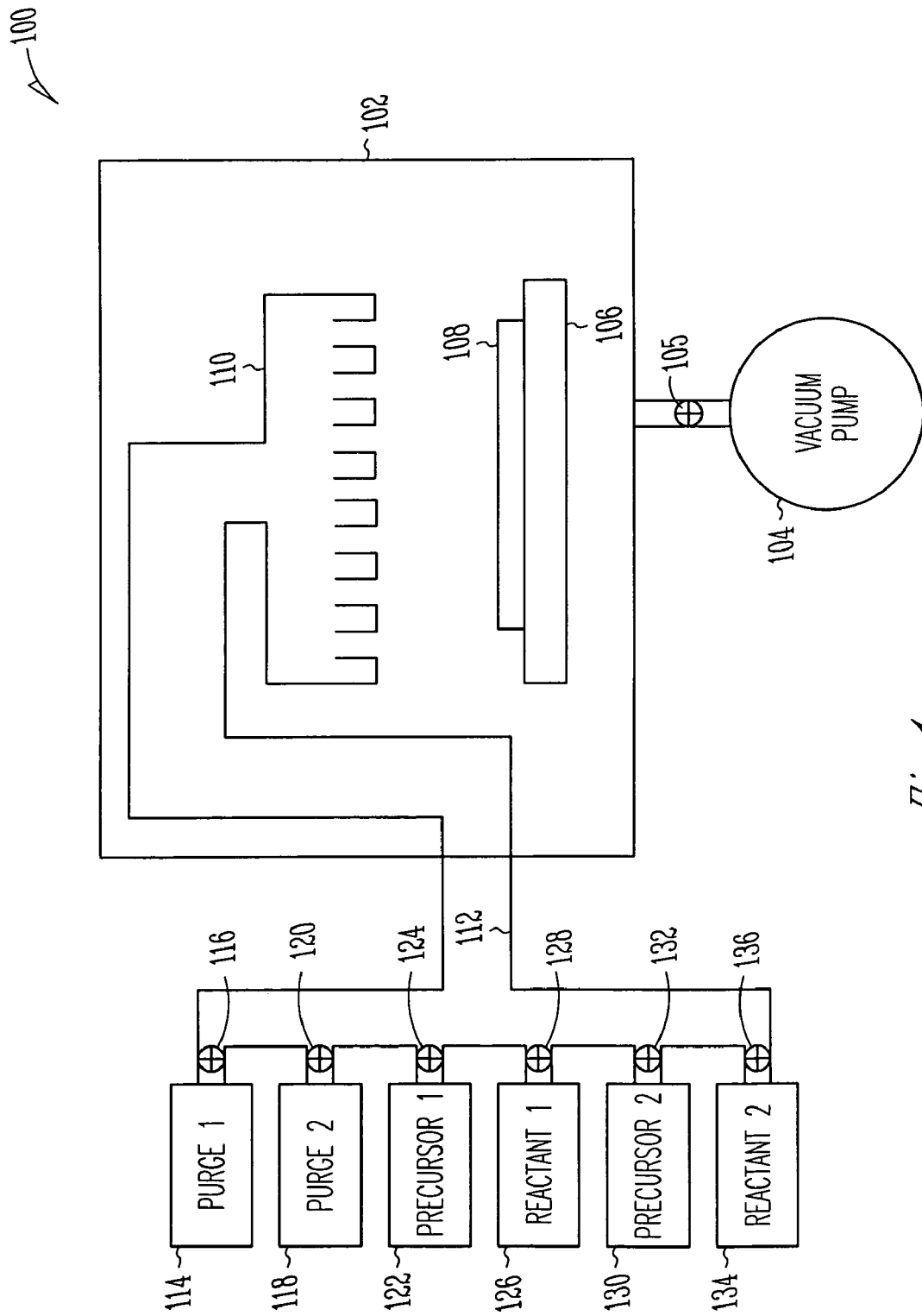
FIG. 1 depicts an atomic layer deposition system for fabricating a single dielectric layer formed as a nanolaminate layered sequence of scandium oxide ($Sc_2O_3$) and gadolinium oxide ($Gd_2O_3$), according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms "wafer" and "substrate" used in the following description include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness (EOT or $t_{eq}$). The equivalent oxide thickness (EOT) quantifies the electrical properties, such as capacitance, of the high k gate dielectric in terms of a representative physical thickness of a silicon dioxide gate dielectric. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the physical $SiO_2$ thickness, t. Thus, with the semiconductor industry moving to scale the gate dielectric equivalent oxide thickness to under 10 Å, the physical thickness requirement for a $SiO_2$ layer used for a gate dielectric would need to be approximately 4 to 7 Å.

Additional requirements for a $SiO_2$ gate dielectric layer would depend on the properties of the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor (CMOS) field effect transistor technology. Thus, future devices may require a physical $SiO_2$ gate dielectric layer of about 5 Å or less. Such a small thickness requirement for a $SiO_2$ oxide layer creates additional problems such as current leakage across the thin dielectric.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good electrical insulator. Significant reductions in its band gap would eliminate $SiO_2$ as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have as complete an arrangement of atoms as found in a thicker, or bulk, layer. As a result of incomplete formation relative to a bulk structure, a thin $SiO_2$ layer of only one or two monolayers will not form a full band gap. The lack of a full band gap in a $SiO_2$ gate dielectric may cause an effective short between an underlying conductive silicon channel and an overlying polysilicon gate. This undesirable property sets a limit on the minimum physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as in a parallel plate capacitance: $C=k\epsilon_0 A/t$, where k is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $k_{ox}=3.9$, as $$t=(k/k_{ox})t_{eq}=(k/3.9)t_{eq}.$$

Thus, materials with a dielectric constant greater than that of $SiO_2$, (typically about 3.9), will have a physical thickness that can be considerably larger than a desired $t_{eq}$, while providing the desired equivalent oxide thickness. For example, an alternative dielectric material with a dielectric constant of 10, such as $Al_2O_3$, could have a thickness of about 25.6 Å to provide a $t_{eq}$ of 10 Å, not including any depletion or inversion layer effects. Thus, a reduced equivalent oxide thickness for transistors can be realized by using dielectric materials with higher dielectric constants than $SiO_2$.

The thinner equivalent oxide thickness (EOT) required for lower transistor operating voltages and smaller transistor dimensions may be realized by a significant number of materials, but additional fabricating requirements makes determining a suitable replacement for $SiO_2$ difficult. The current view for the future of the microelectronics industry still predicts silicon based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sub-layers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(k_{ox}/k)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. Thus a desirable feature of the new high k dielectric would be an oxygen barrier to prevent a layer of $SiO_2$ from forming on the silicon surface. However, whether a single dielectric layer with a high dielectric constant or a barrier layer with a higher dielectric constant than $SiO_2$ is employed, the layer directly in contact with, or interfacing with the silicon layer must provide a high quality interface to maintain high channel carrier mobility.

One of the advantages of using $SiO_2$ as a gate dielectric has been that the formation of the $SiO_2$ layer results in an amorphous gate dielectric. Having an amorphous structure for a gate dielectric provides reduced leakage current problems associated with grain boundaries in polycrystalline gate dielectrics, which may cause high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of existing in a crystalline form, at least in a bulk configuration. The best candidates for replacing $SiO_2$ as a gate dielectric are those with high dielectric constant, which can be fabricated as a thin layer with an amorphous form that can remain amorphous during the thermal cycles typically found in semiconductor production after the growth of the gate dielectric, such as gate electrode growth, metal deposition, and annealing operations. Scandium oxides ($Sc_2O_3$) alloyed with other oxides have been shown to raise the oxide crystallization temperature, and thus stabilize the long term interfacial characteristics of the amorphous dielectric at temperatures up to 1000° C.

Candidates to replace $SiO_2$ include materials with high k dielectric constants, a large energy gap ($E_g$), large energy barrier heights with the silicon substrate for both electrons and holes, and an amorphous nature that resists crystallization during the thermal cycling typically found in semiconductor manufacturing. High k materials may be defined as having a dielectric constant greater than about twice the dielectric constant of silicon dioxide. Generally, the band gap is inversely related to the dielectric constant for a high k material, which lessens some advantages of the high k material because of the potential leakage. A set of high k dielectric candidates for replacing silicon oxide as the dielectric material in electronic components in integrated circuits includes the lanthanide oxides such as $Gd_2O_3$, $Ce_2O_3$, $La_2O_3$, $Pr_2O_3$, $Nd_2O_3$, $Sm_2O_3$, $Dy_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$. Other candidates include various lanthanide silicates and zirconium oxide, $ZrO_2$. Such high dielectric constant layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer.

During a conventional sputtering deposition process, particles of the material to be deposited bombard the surface at a high energy. When a particle hits the surface, some particles adhere, and other particles cause damage. High energy impacts remove body region particles, creating pits. The surface of such a deposited layer may have a rough contour due to the rough interface at the body region, and thus the electrical properties of a thin film may not be as good as the values in a bulk sample of the same material. Thus, the method with which the thin film dielectric is deposited may have a substantial impact on the usefulness of the material in electronic devices.

Until now, no material has been found that meets all the requirements of a proper gate dielectric, such as chemical/structural stability in contact with silicon at high temperatures such as are found in semiconductor processing, a large bandgap and conduction band/valence band offsets to silicon, a high k value, and the ability to remain amorphous during fabrication thermal cycles. Hafnium oxide ($HfO_2$), the most widely studied material, has a dielectric constant of about 20, a bandgap of around 5.6 eV, and conduction band/valence band offsets versus silicon of 2.0 eV/2.5 eV, but loses its amorphous nature at temperatures around 500° C., which is lower than the thermal budget of a typical CMOS process of about 900° C. The loss of amorphous properties may result in leakage down the crystal boundaries. Another potential issue with hafnium oxide is that oxygen may diffuse through the hafnium oxide during subsequent furnace operations, and form a $SiO_2$ layer underneath the hafnium oxide at the silicon interface, resulting in reduced capacitive coupling between the gate electrode and the semiconductor.

In seeking to correct the above noted problems with high k binary metal oxides, it has been found that adding scandium oxide to form ternary rare earth metal oxides results in improved thermal stability, amorphous nature, and oxygen barrier properties with gadolinium, dysprosium and lanthanum oxides, and the dielectric constants still have a k value of about 20. Gadolinium scandium oxide ($GdScO_3$) has a k value of from 19 to 25 depending upon the relative percentages of scandium and gadolinium in the resulting film, a bandgap of from 5.6 to 5.8 eV, and remains amorphous up to 1000° C. The leakage across the dielectric film is between $5\times10^{-7}$ $A/cm^2$ to $10\times10^{-7}$ $A/cm^2$, and it has a dielectric breakdown value of about 2 MV/cm, which may form useful dielectric layers for semiconductor device gate insulators.

By the use of atomic layer deposition (ALD) a $GdScO_3$ layer of 20 nm (i.e., an EOT of about 1.0 nm) may be grown on silicon surfaces with improved surface smoothness of from 0.16 nm to 1.90 nm RMS value, resulting in less electric field concentration at insulator corners and projections. Further, forming such a dielectric film using atomic layer deposition can provide for controlling transitions between different material layers. As a result of such control, atomic layer deposited dielectric film may have an engineered transition with a substrate surface, or may be formed with many thin layers of different dielectric materials to enable selection of the dielectric constant to a value between that available from pure dielectric compounds.

ALD, which may be known as atomic layer epitaxy (ALE), is a modification of chemical vapor deposition (CVD) and may also be called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In the first reaction step of the ALD process, the first precursor saturates and is chemisorbed at the substrate surface during the first pulsing phase. Subsequent pulsing with a purging gas removes excess precursor from the reaction chamber, specifically the precursor that has not been chemisorbed.

The second pulsing phase introduces a second precursor to the substrate where the growth reaction of the desired film takes place, with a reaction thickness that depends upon the amount of chemisorbed first precursor. Subsequent to the film growth reaction, reaction byproducts and precursor excess are purged from the reaction chamber. With a precursor chemistry where the precursors adsorb and react with each other aggressively on the substrate, one ALD cycle can be performed in less than one second in a flow type reaction chamber. Typically, precursor pulse times range from about 0.5 sec to about 2 to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. ALD provides for controlling film thickness in a straightforward manner by controlling the number of growth cycles.

ALD was originally developed to manufacture luminescent and dielectric films needed in electroluminescent displays, such as the growth of doped zinc sulfide and alkaline earth metal sulfide films. ALD has also been studied for the growth of different epitaxial II-V and II-VI films, non-epitaxial crystalline or amorphous oxide and nitride films, and multilayer structures.

The precursors used in an ALD process may be gaseous, liquid or solid; however, liquid or solid precursors should be volatile with a vapor pressure high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary during the process because of changes in solid surface area.

The precursors used in ALD should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on, or react with the surface, though the interaction between the precursor and the surface as well as the mechanism for the adsorption is different for different precursors. The molecules at the substrate surface should react aggressively with the second precursor, which may be called a reactant, to form the desired solid film. Additionally, precursors should not react with the film to cause etching, and precursors should not dissolve in the film. The ability to use highly reactive precursors in ALD contrasts with the selection of precursors for conventional CVD type reactions. The by-products in the reaction should be gaseous in order to allow their easy removal from the reaction chamber during a purge stage. Further, the by-products should not react or adsorb on the surface.

In an ALD process, the self-limiting process sequence involves sequential surface chemical reactions. ALD relies on chemistry between a reactive surface and one or more reactive molecular precursors, which are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of ALD processes, films can be layered in equal metered sequences that are all identical in chemical kinetics, deposition per cycle, composition, and thickness. ALD sequences generally deposit less than a full layer per cycle. Typically, a deposition or growth rate of about 0.25 to about 2.00 Å per cycle can be realized.

Advantages of ALD depositions over other depositions such as CVD include continuity at an interface avoiding poorly defined nucleating regions that are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. ALD processes allow for deposition control on the order of single monolayers and the ability to deposit monolayers of amorphous films.

A cycle of a deposition sequence includes pulsing a first precursor material, pulsing a purging gas for the precursor, pulsing a second reactant precursor, and pulsing the reactant's purging gas, resulting in a very consistent deposition thickness that depends upon the amount of the first precursor that absorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the reactant's purging gas. If the thickness of the first series of cycles results in a dielectric layer that is only a few molecular layers thick, and if the second series of cycles also results in a different dielectric layer that is only a few molecular layers thick, the result is known as a nanolayer material, or a nanolaminate. A nanolaminate means a composite film of ultra thin layers of two or more different materials in a layered stack, where the layers are alternating layers of the different materials having a thickness on the order of a nanometer, and may be a continuous film a single monolayer thick of the material. The nanolayers are not limited to alternating single layers of each material, but may include several layers of one material alternating with a single layer of the other material, to obtain a desired ratio of the two or more materials. Such an arrangement may obtain a dielectric constant that is between the values of the two materials taken singly. The dielectric layer may be made of single layers of the two or more materials deposited individually, but may be essentially a single film formed of an alloy between the two or more individual films. This may depend upon the particular materials being used and their physical and chemical properties relative to one another. If the materials are miscible the result may be a single dielectric layer or alloy.

In an embodiment, a nanolaminate of scandium oxide and gadolinium oxide is formed on a substrate mounted in a reaction chamber in a repetitive sequence using precursor gases individually pulsed into the reaction chamber. An embodiment includes forming the scandium oxide using a metal alkoxy complex precursor gas, such as what may be known as a β-Diketonate, an example of which has a chemical formula of 2,2,6,6 tetramethyl-3,5 heptanedione scandium, herein notated as $Sc(thd)_3$, or other organometallic materials, such as $(C_5H_5)_3Sc$. An embodiment includes forming the gadolinium oxide using a metal alkoxy complex precursor gas, such as $Gd(thd)_3$. Other solid or liquid precursors may be used in an appropriately designed reaction chamber. The use of such precursors in an ALD reaction chamber may result in lower deposition temperatures in the range of 300° C. to 400° C. or lower, and the ability to use mildly oxidizing reactant materials such as $H_2O$, $H_2O_2$, various alcohols, $N_2O$, ozone or oxygen. Purge gases may include nitrogen, helium, argon or neon. It should be noted that the use of the term reactant means a precursor material that is added to the ALD reaction chamber to react with the previously introduced precursor material, to form a nanolayer of the product material. There is no difference between a precursor material and a reactant material other than the order in which they enter the reaction chamber.

FIG. 1 shows an embodiment of an atomic layer deposition system 100 for forming a dielectric film containing scandium oxide alternating with gadolinium oxide. The elements depicted permit discussion of the present invention such that those skilled in the art may practice the present invention without undue experimentation. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the region of the surface of substrate 108 in a uniform fashion. The gases introduced by the gas distribution fixture, sometimes referred to as a showerhead in the illustrated embodiment, react with the substrate 108, with any excess precursor gas and reaction products removed from chamber 102 by vacuum pump 104 through a control valve 105. The system 100 may operate at any desired deposition pressure by controlling the volume of gas entering the chamber 102 as compared to the volume of gaseous reaction product and excess gases removed from the chamber 102 via control of the pumping rate of vacuum pump 104, and the valve 105. ALD systems may operate at normal atmospheric pressures, or may operate under essentially vacuum conditions, or somewhere in between. In an embodiment, the gadolinium oxide layers are formed at a reduced pressure of 2 to 3 millibars.

Each gas originates from individual gas sources 114, 118, 122, 126, 130, and 134, with a flow rate and time controlled by mass-flow controllers 116, 120, 124, 128, 132 and 136, respectively. Gas sources 122 and 130 provide a precursor gas either by storing the precursor as a gas or by providing a location and apparatus for evaporating a solid or liquid material to form the selected precursor gas by evaporation, sublimation or entrainment in a gas stream.

Also included in the system are purging gas sources 114 and 118, coupled to mass-flow controllers 116 and 120, respectively. The embodiment may use only one of the purge gases for all four disclosed illustrative purging steps, or both purge gases may be used simultaneously, or alternately as required for the particular desired result. Furthermore, additional purging gas sources can be constructed in ALD system 100, one purging gas source for each different precursor and reactant gas, for example. For a process that uses the same purging gas for multiple precursor gases, fewer purging gas sources may be required for ALD system 100. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other commercially available ALD systems may also be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure. The elements of ALD system 100 may be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be under computer control.

Figure 2:
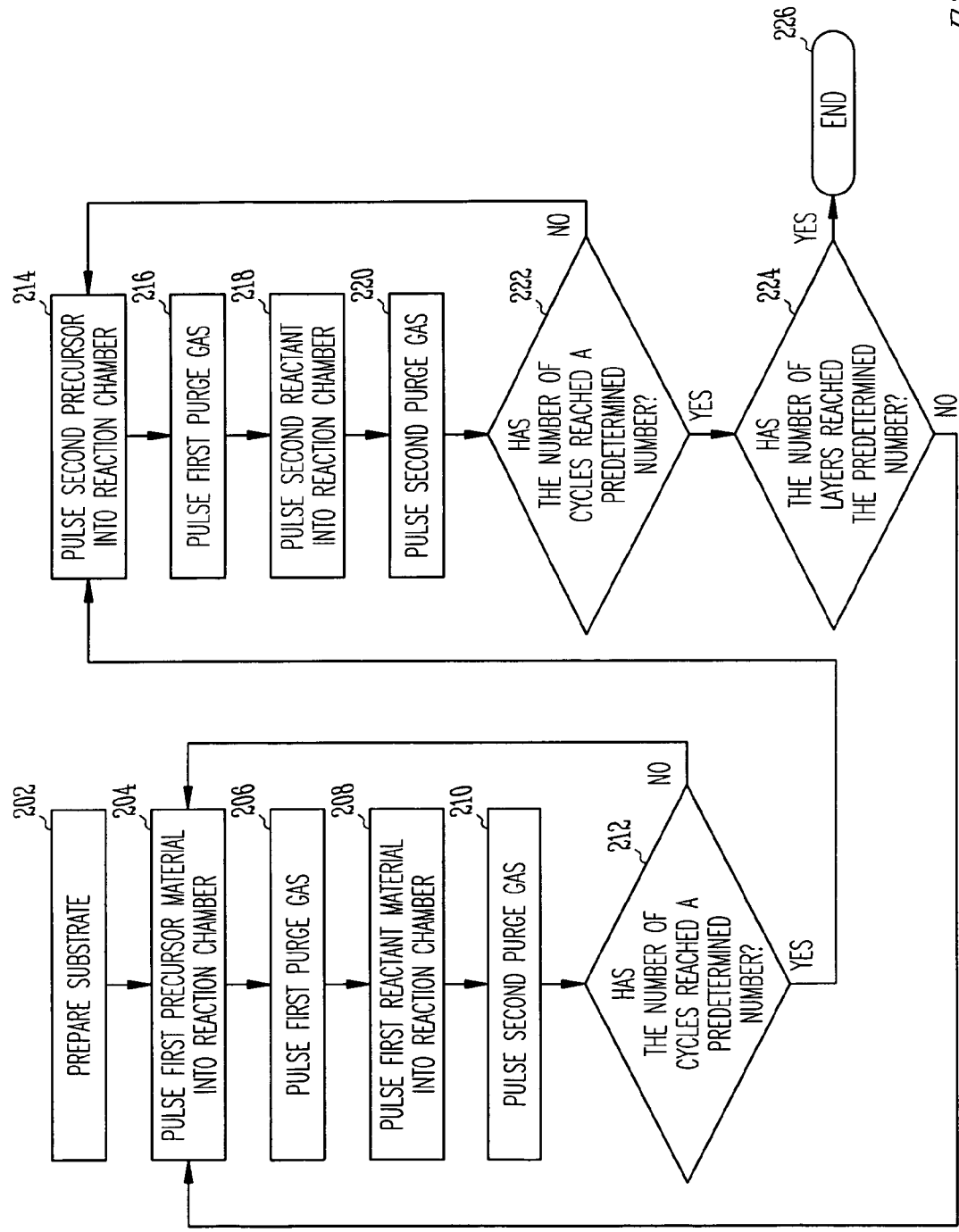
FIG. 2 illustrates a flow diagram of elements for an embodiment of a method to form a dielectric layer containing a nanolaminate layered sequence of scandium oxide ($Sc_2O_3$) and gadolinium oxide ($Gd_2O_3$) layers, by atomic layer deposition according to various embodiments of the present invention.

FIG. 2 illustrates a flow diagram of operational steps for an embodiment of a method to form a nanolaminate dielectric layer containing a scandium oxide alternating with gadolinium oxide layer. Again note that the resulting laminate film may act as a single film having a general formula of the form $Gd_xSc_yO_3$, where X plus Y should equal approximately 2.0, and in an embodiment the film will have a formula of $GdScO_3$. The dielectric layer is not required to have a stoichiometric ratio, and the individual dielectric materials, such as the scandium oxide and gadolinium oxide, are not required to be formed with stoichiometric values. The relative ratios of the different components of the dielectric layers may be easily varied depending upon the specific process values used. At 202, a substrate is prepared to react immediately with, and chemisorb the first precursor gas. This preparation will remove contaminants such as thin organic films, dirt, and native oxide from the surface of the substrate, and may include a hydrofluoric acid rinse, or sputter etch in the reaction chamber 102 of FIG. 1. At 204 a first precursor material enters the reaction chamber for a predetermined length of time, in an embodiment $Gd(thd)_3$ gas for from 0.5-2.0 seconds, preferably 1.25 seconds. An embodiment includes the first precursor material being a metal alkoxy complex precursor gas, in one embodiment the metal alkoxy comprises 2,2,6,6 tetramethyl-3,5 heptanedione gadolinium (i.e., $Gd(thd)_3$), but other gadolinium containing gases, liquids and sublimating solids may also be used. The first precursor material is chemically absorbed onto the surface of the substrate, the amount depending at least in part upon the temperature of the substrate, in one embodiment 300 degrees C., and at least in part on the presence of sufficient flow of the precursor material. In addition, the pulsing of the precursor may use a pulsing period that provides uniform coverage of an absorbed monolayer on the substrate surface, or may use a pulsing period that provides partial formation of a monolayer on the substrate surface.

At 206 a first purge gas enters the reaction chamber for a predetermined length of time sufficient to remove substantially all of the non-chemisorbed first precursor material. Typical times may be 1.0-2.0 seconds, with a purge gas comprising nitrogen, argon, neon, hydrogen and combinations thereof.

At 208 a first reactant gas enters the chamber for a predetermined length of time, sufficient to provide enough of the reactant material to chemically combine with the amount of chemisorbed first precursor material on the surface of the substrate. In an embodiment the reactant material for the Gd(thd)$_3$ first precursor comprises ozone (i.e., O$_3$) for a pulse length of 2.50 seconds. Typical reactant materials include mildly oxidizing materials, including, but not limited to, water vapor, hydrogen peroxide, nitrogen oxides, ozone and oxygen gas, and combinations thereof. At 210 a second purge gas, which may be the same or different from the first purge gas, enters the chamber for a predetermined length of time, sufficient to remove substantially all non-reacted materials and any reaction byproducts from the chamber.

At 212 a decision is made as to whether the thickness of the first dielectric material in the nanolaminate dielectric has reached the desired thickness, or whether another deposition cycle is required. In an embodiment, the thickness of the Gd$_2$O$_3$ layer obtained from a single ALD cycle is from 0.025 nm to 0.035 nm, more preferably 0.031 nm. If another deposition cycle is needed to reach the desired thickness, then the operation returns to 204 and repeats the deposition process until the desired first dielectric layer is completed, at which time the process moves on to the deposition of the second material at 214.

At 214 a second precursor material for the second dielectric material enters the reaction chamber for a predetermined length of time, typically 0.5-2.0 seconds. An embodiment includes the first precursor material being a metal alkoxy complex precursor gas such as scandium diketonates, but other scandium containing materials, in gas, liquid or sublimating solid form, may also be used. In an embodiment, the second precursor comprises Sc(thd)$_3$ pulsed for 0.8 seconds. In another embodiment the second precursor comprises triscyclopentadienyl scandium, (C$_5$H$_5$)$_3$Sc. The second precursor material is chemically adsorbed onto the surface of the substrate, in this case being the top surface of the first dielectric material, the amount of absorption depending upon the temperature of the substrate, in one embodiment 300° C., and the presence of sufficient flow of the precursor material. In addition, the pulsing of the precursor may use a pulsing period that provides uniform coverage of an absorbed monolayer on the substrate surface, or may use a pulsing period that provides partial formation of a monolayer on the substrate surface.

At 216 the first purge gas is shown as entering the chamber, but the invention is not so limited. The purge gas used in the second dielectric material deposition may be the same or different from either of the two previously noted purge gases, and FIG. 1 could be shown as having more than the two purge gases shown. The purge cycle continues for a predetermined length of time sufficient to remove substantially all of the non-chemisorbed second precursor material.

At 218 a second reactant gas, which may be the same or different from the first reactant gas, enters the chamber for a predetermined length of time, sufficient to provide enough of the reactant to chemically combine with the amount of chemisorbed second precursor material on the surface of the substrate. In an embodiment the reactant used with the Sc(thd)$_3$ precursor comprises ozone with a pulse time of 2.0 seconds, resulting in a layer of Sc$_2$O$_3$ of 0.0125 nm. In another embodiment the reactant comprises a mixture of ozone with hydrogen peroxide having a pulse time of 2.0 seconds, resulting in a Sc$_2$O$_3$ layer thickness of 0.0140 nm. In yet another embodiment the reactant used with the triscyclopentadienyl scandium, (C$_5$H$_5$)$_3$Sc precursor comprises ozone with a pulse time of 2.0 seconds, resulting in a Sc$_2$O$_3$ layer thickness of 0.075 nm at 300° C. At 220 another purge gas enters the chamber, which may be the same or different from any of the three previously discussed purge gases, for a predetermined length of time, sufficient to remove non-reacted materials and any reaction byproducts from the chamber.

At 222 a decision is made as to whether or not the thickness of the second dielectric material in the nanolaminate dielectric has reached the desired thickness, or whether another deposition cycle is required. If another deposition cycle is needed, then the operation returns to 214, until the desired second dielectric layer is completed. The desired thicknesses of the first and second dielectric materials in the nanolaminate dielectric may not be the same thickness, and there may be more deposition cycles for one dielectric material than for the other. For example, in one embodiment the number of scandium oxide layers deposited using the Sc(thd)$_3$ precursor is three layers to equal 0.036 nm thickness, for each one layer of gadolinium oxide having a thickness of 0.031, to provide a merged effectively single dielectric layer having a formula of GdScO$_3$.

If the second dielectric layer has reached the desired thickness, the process moves on to a decision at 224 of whether the number of layers of the first and second dielectric materials has reached the desired number for the finished dielectric film. If more than a single layer of each dielectric material is desired, the process moves back to another deposition of the first dielectric material at 204. After the number of interleaved layers of dielectrics one and two has reached the desired value, the deposition ends at 226. Although the present illustrative embodiment discusses and illustrates that the layers are distinct from each other, the individual layers are very thin and may act effectively as a single alloy layer. The present illustrative embodiment has the gadolinium oxide layer deposited first, but the invention is not so limited.

The embodiments described herein provide a process for growing a dielectric film having a wide range of useful equivalent oxide thickness, $t_{eq}$, with a dielectric constant in the range from about 15 to 25. This range of dielectric constants provides for a $t_{eq}$ ranging from about 15% to about 25% relative to a given silicon dioxide thickness. As compared to an electrically equivalent silicon dioxide thickness, an embodiment for a scandium/gadolinium oxide may be from about four to six times thicker than the silicon dioxide thickness for reduced dielectric leakage current due to the thicker dielectric layer. Further, dielectric films formed by atomic layer deposition can provide not only equivalent thin $t_{eq}$ films, but also films with relatively low leakage current due to the improved surface smoothness. The ALD process can be implemented to form transistors, capacitors, memory devices, and other electronic systems including information handling devices. The invention is not limited to two dielectric materials (that is, a binary dielectric), and the equipment described in FIG. 1 could have included a precursor and reactant 3, 4, which are not described for simplicity.

Figure 3:
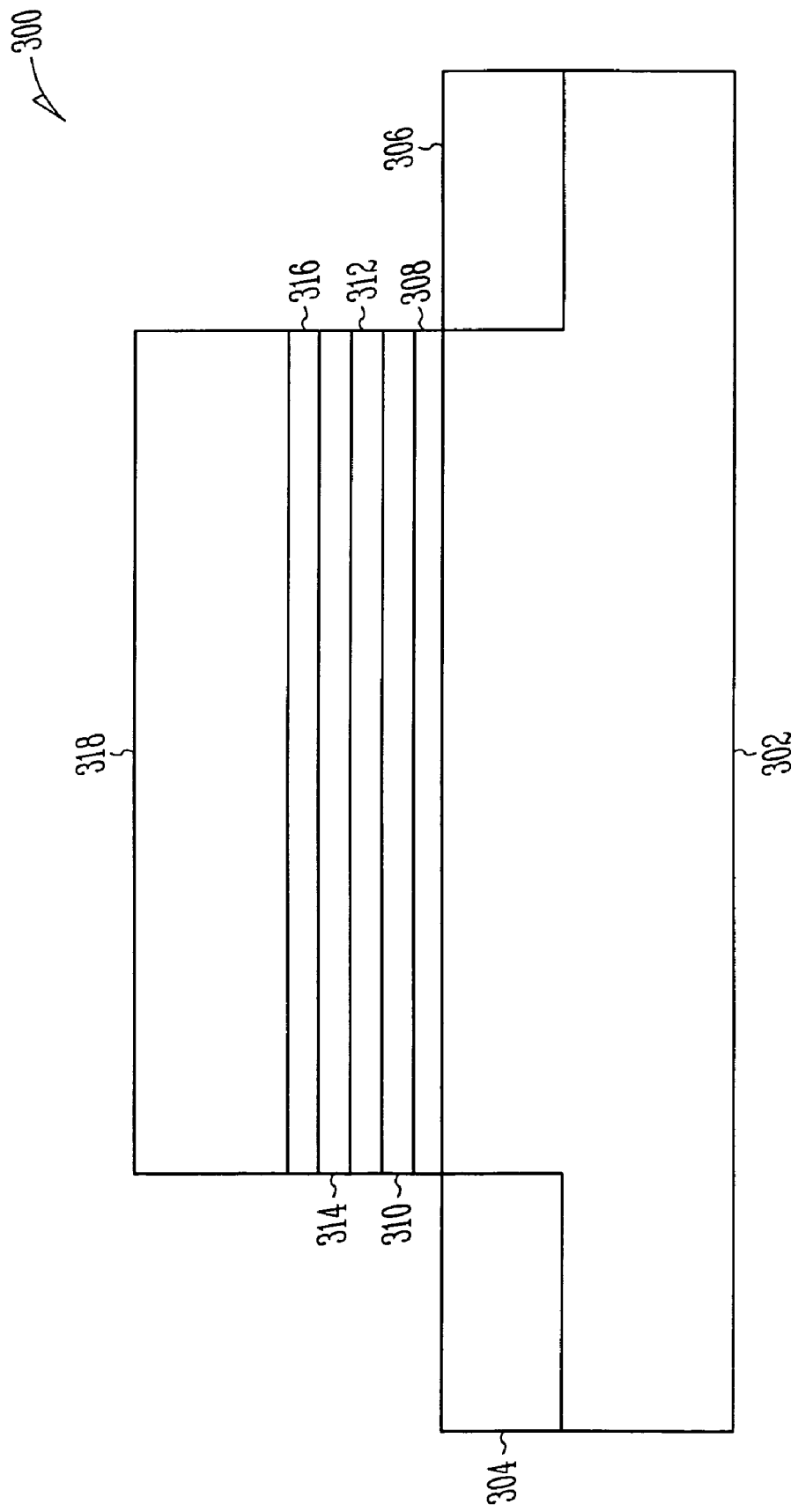
FIG. 3 illustrates an embodiment of a transistor having a dielectric layer containing an atomic layer deposited nanolaminate layered sequence of scandium oxide ($Sc_2O_3$) and gadolinium oxide ($Gd_2O_3$) dielectric layers, according to the present invention.

FIG. 3 illustrates a single transistor in an embodiment of a method to form a dielectric layer containing an ALD deposited gadolinium oxide/scandium oxide gate oxide layer. A substrate 302 is prepared for deposition, typically a silicon or silicon-containing material; however, other semiconductor materials such as germanium, gallium arsenide, silicon-on-sapphire substrates may also be used. This preparation process includes cleaning substrate 302 and forming various layers and regions of the substrate, such as drain diffusion 304 and source diffusion 306 of an illustrative metal oxide semiconductor (MOS) transistor 300, prior to forming a gate dielectric. The substrate 302 is typically cleaned to provide an initial substrate depleted of its native oxide, since the presence of a thin layer of $SiO_2$ will result in decreased capacitive coupling. The substrate may also be cleaned to provide a hydrogen-terminated surface. As an illustrative embodiment, a silicon substrate may undergo a final hydrofluoric (HF) acid rinse prior to ALD processing to provide the silicon substrate with a hydrogen-terminated surface without a native silicon oxide layer. Cleaning immediately preceding atomic layer deposition aids in reducing an occurrence of silicon oxide at an interface between a silicon-based substrate and a dielectric formed using the atomic layer deposition process. The sequencing of the formation of the regions of the transistor being processed may follow typical sequencing that is generally performed in the fabrication of a MOS transistor, as is well known to those skilled in the art.

The dielectric covering the area on the substrate 302 between the source and drain diffused regions 304 and 306 is deposited by ALD in this illustrative embodiment, and comprises gadolinium oxide layers 308, 312, and 316, having interleaved scandium oxide layers, 310 and 314. This alloy dielectric layer may be referred to as the gate oxide. In this illustrative embodiment the gadolinium oxide layer 308 is shown as being the first layer and in direct contact with the substrate 302; however, the invention is not so limited. There may be a diffusion barrier layer inserted between the first dielectric layer 308 and the substrate 302 to prevent metal contamination from affecting the electrical properties of the device. The described embodiment may also include having the first dielectric layer as scandium oxide, since this affects the surface states and the work function of the dielectric layer. The illustrative embodiment also shows the different dielectric layers having the same thickness, however the desired dielectric properties of the nanolaminate film may be best achieved by adjusting the ratio of the thickness of the two dielectric materials to different values. Even though the illustrative embodiment shows the gadolinium oxide layers as being distinct from the scandium oxide layers, the gate oxide (layers 308 to 316) in total appears as a single alloyed dielectric layer having a preferred formula of $GdScO_3$. The transistor 300 has a conductive material forming a single gate electrode 318 in this illustrative embodiment, but the nanolaminate dielectric may also be used in a floating gate device as both the floating gate and the control gate oxide layers found in non volatile memory technologies such as flash memory.

In an embodiment, gate dielectric (layers 308-316) may form a tunnel gate insulator and a floating gate dielectric in a flash memory device. Use of dielectric layers containing a nanolaminate atomic layer deposited dielectric layer for a gate dielectric and/or floating gate dielectric in which the dielectric layer contacts a conductive layer is not limited to silicon based substrates, but may be used with a variety of semiconductor substrates.

Figure 4:
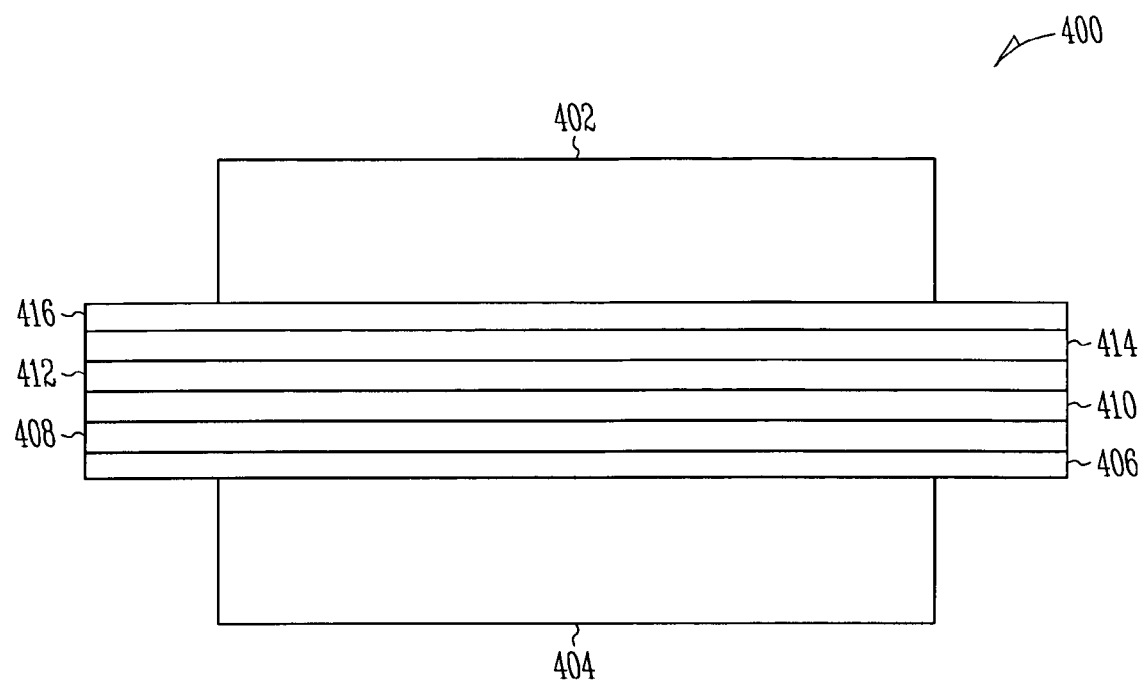
FIG. 4 shows an embodiment of a capacitor having a dielectric layer containing an atomic layer deposited nanolaminate layered sequence of scandium oxide ($Sc_2O_3$) and gadolinium oxide ($Gd_2O_3$) dielectric layers, according to the present invention.

The embodiments of methods for forming ALD deposited dielectric layers contacting a conductive layer may also be applied to forming capacitors in various integrated circuits, memory devices, and electronic systems. In an embodiment for forming a capacitor 400 illustrated in FIG. 4, a method includes forming a first conductive layer 402, a second conductive layer 404, and a nanolaminate dielectric having interleaved layers 406, 408, 410, 412, 414 and 416 of two or more different dielectric materials formed between the two conductive layers. The conductive layers 402 and 404 may be formed of metals, doped polysilicon, silicided metals, polycides, or conductive organic compounds, without affecting the teaching of this embodiment. The sequencing of the layers may depend upon the application, or may be less important in the case of an alloyed single layer, such as the described embodiment of an effectively single dielectric layer having a formula of $GdScO_3$. The effective dielectric constant associated with a nanolaminate structure is attributable to N capacitors in series, where each capacitor has a thickness defined by the thickness of the corresponding layer. By selecting each thickness and the composition of each layer, a nanolaminate structure can be engineered to have a predetermined dielectric constant. Structures such as nanolaminate structure shown in FIGS. 3 and 4 may be used in non-volatile flash memory devices as well as other integrated circuits. Transistors, capacitors, and other devices having dielectric films may be implemented into memory devices and electronic systems including information handling devices. Embodiments of these information handling devices may include wireless systems, telecommunication systems, computers and integrated circuits.

Figure 5:
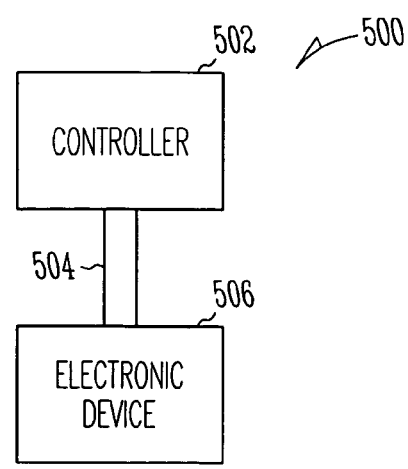
FIG. 5 is a simplified diagram for an embodiment of a controller coupled to an electronic device, according to the present invention.

FIG. 5 illustrates a diagram for an electronic system 500 having one or more devices having a dielectric layer containing an atomic layer deposited oxide layer formed according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a dielectric layer containing an ALD deposited oxide layer as previously discussed herein. Electronic system 500 may include, but is not limited to, information handling devices, wireless systems, telecommunication systems, fiber optic systems, electro-optic systems, and computers.

Figure 6:
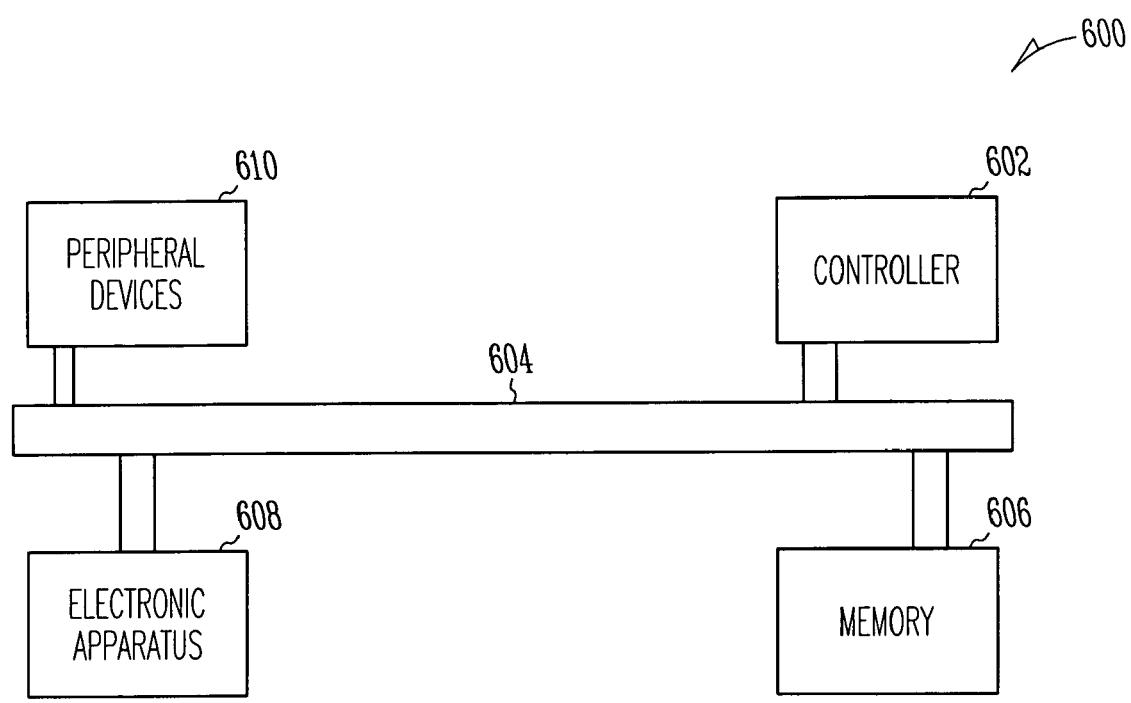
FIG. 6 illustrates a diagram for an embodiment of an electronic system having devices with a dielectric film containing an atomic layer deposited nanolaminate layered sequence of scandium oxide ($Sc_2O_3$) and gadolinium oxide ($Gd_2O_3$) dielectric layers, according to the present invention.

FIG. 6 depicts a diagram of an embodiment of a system 600 having a controller 602 and a memory 606. Controller 602 and/or memory 606 may include a dielectric layer having an ALD dielectric layer. System 600 also may include an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 may also use common conductive lines for providing address, data, and/or control, the use of which may be regulated by controller 602. In an embodiment, electronic apparatus 608 may include additional memory devices configured similarly to memory 606. An embodiment may include an additional peripheral device or devices 610 coupled to bus 604. In an embodiment controller 602 is a processor. Any of controller 602, memory 606, bus 604, electronic apparatus 608, and peripheral devices 610 may include a dielectric layer having an ALD deposited oxide layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Gadolinium oxide/scandium oxide layers formed by ALD may be processed in relatively low temperatures, such as 300° C., and may be amorphous and possess smooth surfaces. Such oxide films may provide enhanced electrical properties as compared to those formed by physical deposition methods, such as sputtering, or typical chemical layer depositions, due to their smoother surface and reduced damage, resulting in reduced leakage current. In particular the alloy of scandium oxide into other high k metal oxides improves the ability of gadolinium oxide films to remain in an amorphous state at the relatively high processing temperatures used in transistor fabrication processes, and improves the thermal stability and interface properties of the resultant dielectric film.

Such dielectric layers may have adjustable dielectric constants that are higher than the commonly used silicon dioxide and silicon nitrides based dielectrics, and may provide a significantly thicker physical thickness than a silicon oxide layer having the same equivalent oxide thickness, where the increased thickness may reduce leakage current, and reduce oxide shorts due to pinholes and other reduced thickness areas. These properties allow for application as dielectric layers in numerous electronic devices and systems.

Capacitors, transistors, higher level ICs or devices including memory devices, and electronic systems are constructed utilizing the described ALD process for forming a dielectric film having a thin equivalent oxide thickness, $t_{eq}$. Gate dielectric layers or films containing atomic layer deposited metal oxides have a dielectric constant (k) substantially higher than that of silicon dioxide, such that these dielectric films are capable of a $t_{eq}$ thinner than $SiO_2$ gate dielectrics of the same physical thickness. Alternatively, the high dielectric constant relative to silicon dioxide allows the use of much greater physical thickness of these high k dielectric materials for the same $t_{eq}$ of $SiO_2$.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
    forming a dielectric layer including at least scandium oxide and gadolinium oxide formed by atomic layer deposition on a surface of a substrate; and
    forming a conductive layer on the dielectric layer;
    wherein the dielectric layer is formed of a selected number of layers of scandium oxide and a selected number of layers of gadolinium oxide.

2. The method of claim 1, wherein the scandium oxide includes an amorphous oxide having a formula of $Sc_2O_3$.

3. The method of claim 1, wherein the gadolinium oxide includes an amorphous oxide having a formula of $Gd_2O_3$.

4. The method of claim 1, wherein the dielectric layer includes a ratio of $Sc_2O_3$ to $Gd_2O_3$ of approximately 1 to 1.

5. The method of claim 4, wherein the ratio has a limit of 20% variation from the 1 to 1 value.

6. The method of claim 1, wherein the substrate includes at least two diffused regions having a first conductivity type, separated by a region of a second conductivity type disposed below the dielectric layer and metal layer.

7. The method of claim 6, wherein the substrate is a silicon crystal having a <100> crystal orientation at the surface, and the dielectric has an equivalent oxide thickness of 1.0 nm.

8. The method of claim 7, wherein the method is a method of forming a transistor device.

9. The method of claim 7, wherein the method is a method of forming a memory device.

10. The method of claim 1, wherein the substrate includes a conductive layer disposed below the dielectric layer.

11. The method of claim 10, wherein the method is a method of forming a capacitive device.

12. The method of claim 1, wherein each individual one of the gadolinium oxide layers is less than or equal to two monolayers in thickness.

13. The method of claim 1, wherein each individual one of the scandium oxide layers is a continuous monolayer.

14. The method of claim 1, wherein the dielectric layer has a root mean square surface roughness that is less than one tenth of the layer thickness.

15. The method of claim 1, wherein the dielectric layer has a root mean square surface roughness that is less than 1.5 Angstroms.

16. The method of claim 1, wherein the dielectric layer has a dielectric constant of greater than 17.

17. The method of claim 1, wherein the dielectric layer is separated from the substrate by a diffusion barrier.

18. The method of claim 1, wherein the dielectric layer is formed at a temperature of less than 350°C.

19. A method comprising:
    forming a dielectric layer including at least scandium oxide and gadolinium oxide formed by atomic layer deposition on a surface of a substrate; and
    forming a metal layer on the dielectric layer;
    wherein the gadolinium oxide dielectric layer is formed using a first precursor material comprising diketonate gadolinium having a formula $Gd(thd)_3$, where thd represents 2,2,6,6-tetramethyl -3,5-heptanedione.

20. The method of claim 19, wherein a reactant comprising ozone follows the precursor at a selected later time.

21. The method of claim 20, wherein the gadolinium oxide layer is formed of a selected number of individual layers of gadolinium oxide, each individual layer of gadolinium oxide is formed by a single cycle of atomic layer deposition and having a thickness of about 0.031 nm.

22. The method of claim 21, wherein the gadolinium oxide layer is formed at a reduced pressure of 2-3 millibars.

23. A method comprising:
    forming a dielectric layer including at least scandium oxide and gadolinium oxide formed by atomic layer deposition on a surface of a substrate; and
    forming a metal layer on the dielectric layer;

wherein the scandium oxide dielectric layer is formed using a precursor material comprising $Sc(thd)_3$, where thd represents 2,2,6,6-tetramethyl-3,5-heptanedione.

24. The method of claim 23, wherein a reactant material comprising ozone follows the precursor at a selected later time.

25. The method of claim 23, wherein a reactant comprising at least one material selected from the list including ozone, water vapor, hydrogen peroxide, sequential combination thereof and simultaneous combinations thereof follows the precursor at a selected later time.

26. The method of claim 1, wherein the scandium oxide dielectric layer is formed using a precursor material selected from a list including $(C_5H_5)Sc$ and $Sc(thd)_3$, where thd represents 2,2,6,6-tetramethy1-3,5-heptanedione.

27. The method of claim 24, wherein the scandium oxide layer is formed of a selected number of individual layers of scandium oxide, each individual layer of scandium oxide is formed by a single cycle of atomic layer deposition and having a thickness of about 0.0 125nm.

28. The method of claim 25, wherein the reactant is a mixture of ozone and hydrogen peroxide, and the scandium oxide layer is formed of a selected number of individual layers of scandium oxide, each individual layer of scandium oxide formed by a single cycle of atomic layer deposition and having a thickness of about 0.014 nm.

29. The method of claim 26, wherein a reactant material comprises water vapor and follows the precursor material at a selected later time.

30. The method of claim 29, wherein the scandium oxide layer is formed of a selected number of individual layers of scandium oxide, each individual layer of scandium oxide formed by a single cycle of atomic layer deposition and having a thickness of about 0.075 nm.

31. A method comprising:
forming a dielectric layer including at least scandium oxide and gadolinium oxide formed by atomic layer deposition on a surface of a substrate; and
forming a metal layer on the dielectric layer;
wherein the dielectric layer is formed by:
exposing an activated substrate surface at a preselected temperature to a first precursor material for a preselected first time period and a preselected flow volume of the first precursor material to saturate the substrate surface with the first precursor material;
exposing the substrate surface to a preselected volume of a first purge material for a preselected second time period to remove substantially all of a non-absorbed portion of the first precursor material from the substrate surface;
exposing the substrate surface to a preselected volume of a first reactant material for a preselected substrate surface to form a first dielectric material having a first intermediate thickness to complete a first third time period to react with the absorbed portion of the first precursor material on the deposition cycle;
exposing the substrate surface to a preselected volume of a second purge material for a preselected fourth time period to remove substantially all of a non-reacted portion of the first reactant material, and a first plurality of gaseous reaction byproducts from the substrate surface;
repeating the first deposition cycle until a preselected final first dielectric material thickness is obtained;
exposing the substrate surface to a second precursor material for a preselected fifth time period and a preselected flow volume of the second precursor material to saturate the substrate surface with the second precursor material;
exposing the substrate surface to a preselected volume of a third purge material for a preselected sixth time period to remove substantially all of a non-absorbed portion of the second precursor material from the substrate surface;
exposing the substrate surface to a preselected volume of a second reactant material for a preselected seventh time period to react with the absorbed portion of the second precursor material on the substrate surface to form a second dielectric material having a second intermediate thickness to complete a second deposition cycle;
exposing the substrate surface to a preselected volume of a fourth purge material for a preselected eighth time period to remove substantially all of a non-reacted portion of the second reactant material, and a second plurality of gaseous reaction byproducts from the substrate surface; and
repeating the second deposition cycle until a preselected final second dielectric material thickness is obtained.

32. The method of claim 31, wherein the process of forming the final first dielectric layer thickness and the final second dielectric layer thickness is repeated to form multiple interleaved layers of the first and second dielectric layers having a preselected overall dielectric layer thickness and dielectric constant.

33. The method of claim 32, wherein the first dielectric layer and the second dielectric layer are closely intermingled to form an effective single layer having physical properties determined by the ratio of the first and second layers.

* * * * *

UNITED STATES PATENT AND TRADEMARK OFFICE
CERTIFICATE OF CORRECTION

PATENT NO. : 7,544,596 B2  Page 1 of 1
APPLICATION NO. : 11/215507
DATED : June 9, 2009
INVENTOR(S) : Kie Y. Ahn et al.

It is certified that error appears in the above-identified patent and that said Letters Patent is hereby corrected as shown below:

On the Title Page, Item (54), in "Title", line 1, delete "GDSCO3" and insert -- $GdScO_3$ --, therefor.

In column 1, line 1, delete "GDSCO3" and insert -- $GdScO_3$ --, therefor.

In column 17, line 15, in Claim 26, delete "tetramethy 1-3," and insert -- tetramethyl-3, --, therefor.

In column 17, line 20, in Claim 27, delete "0.0 125nm." and insert -- 0.0125 nm. --, therefor.

In column 18, line 4, in Claim 31, after "preselected" insert -- third time period to react with the absorbed portion of the first precursor material on the --.

In column 18, line 6, in Claim 31, after "first" delete "third time period to react with the absorbed portion of the first precursor material on the".

Signed and Sealed this

Fourth Day of August, 2009

JOHN DOLL
*Acting Director of the United States Patent and Trademark Office*